(12) United States Patent
Sonkar et al.

(10) Patent No.: US 9,966,131 B2
(45) Date of Patent: May 8, 2018

(54) USING SENSE AMPLIFIER AS A WRITE BOOSTER IN MEMORY OPERATING WITH A LARGE DUAL RAIL VOLTAGE SUPPLY DIFFERENTIAL

(71) Applicant: Synopsys, Inc., Mountain View, CA (US)

(72) Inventors: Dharmesh Kumar Sonkar, Sunnyvale, CA (US); Niranjan Behera, Newark, CA (US)

(73) Assignee: Synopsys, Inc., Mountain View, CA (US)

( * ) Notice: Subject to any disclaimer, the term of this patent is extended or adjusted under 35 U.S.C. 154(b) by 0 days. days.

(21) Appl. No.: 14/832,968

(22) Filed: Aug. 21, 2015

(65) Prior Publication Data
US 2017/0053695 A1 Feb. 23, 2017

(51) Int. Cl.
*G11C 7/06* (2006.01)
*G11C 7/08* (2006.01)
*G11C 11/419* (2006.01)
*G11C 7/18* (2006.01)
*G11C 11/413* (2006.01)

(52) U.S. Cl.
CPC .............. *G11C 11/419* (2013.01); *G11C 7/18* (2013.01); *G11C 11/413* (2013.01)

(58) Field of Classification Search
CPC .................................................. G11C 11/419
USPC .......................... 365/189.14, 189.16, 189.05
See application file for complete search history.

(56) References Cited

U.S. PATENT DOCUMENTS

| | | | | |
|---|---|---|---|---|
| 5,982,689 A * | 11/1999 | Takahashi | ............... | G11C 7/065 327/51 |
| 6,215,708 B1 * | 4/2001 | Lien | ........................ | G11C 5/145 365/189.09 |
| 6,356,473 B1 * | 3/2002 | Shimoyama | ............. | G11C 7/22 365/154 |
| 8,971,133 B1 * | 3/2015 | Zheng | .................. | G11C 7/1096 365/185.25 |
| 2006/0274587 A1 * | 12/2006 | Houston | ............... | G11C 11/413 365/203 |
| 2008/0002497 A1 * | 1/2008 | Barth, Jr. | .................. | G11C 7/12 365/205 |
| 2010/0315890 A1 * | 12/2010 | Yen-Huei | .............. | G11C 11/413 365/191 |

(Continued)

*Primary Examiner* — Hoai V Ho
*Assistant Examiner* — Jay Radke
(74) *Attorney, Agent, or Firm* — Bever, Hoffman & Harms, LLP (57) ABSTRACT

A memory includes a memory cell that operates in response to an array supply voltage, and a corresponding pair of bit lines that are pre-charged to a periphery supply voltage prior to each access of the memory cell. A sense amplifier coupled to the bit lines operates in response to the periphery supply voltage. The periphery supply voltage is less than the array supply voltage to enable power savings within the memory. A first pair of transistors is configured to couple the sense amplifier to the bit lines during write accesses to the memory cell, thereby boosting the write voltages applied to the bit lines during a write operation. That is, the first pair of transistors is configured such that the sense amplifier pulls one of the bit lines toward the periphery supply voltage (and the other one of the bit lines toward the ground supply voltage) during write accesses.

24 Claims, 3 Drawing Sheets

(56) References Cited

U.S. PATENT DOCUMENTS

| | | | |
|---|---|---|---|
| 2011/0199817 A1* | 8/2011 | Joshi | G11C 7/12 365/156 |
| 2012/0082174 A1* | 4/2012 | Chen | G11C 7/065 370/546 |
| 2015/0029778 A1* | 1/2015 | Yoon | G11C 7/24 365/104 |
| 2015/0098267 A1* | 4/2015 | Jain | G11C 7/12 365/154 |
| 2015/0131368 A1 | 5/2015 | Adams et al. | |

* cited by examiner

USING SENSE AMPLIFIER AS A WRITE BOOSTER IN MEMORY OPERATING WITH A LARGE DUAL RAIL VOLTAGE SUPPLY DIFFERENTIAL

FIELD OF THE INVENTION

The present invention relates to memories that operate with a large dual rail voltage supply differential. More specifically, the present invention relates to the use of a sense amplifier to boost write operations in a memory having a large differential between a memory array voltage and a peripheral device voltage, or in a memory where the periphery device voltage is very low.

RELATED ART

The Internet of Things (IoT) is accelerating rapidly, bringing with it a wealth of opportunities. In the context of embedded memories, such as embedded static random access memories (SRAMs), it is desirable for the memory periphery circuitry to operate at a very low voltage (to minimize power consumption) while the memory array is required to operate at a significantly higher (minimum) voltage. For example, memory periphery circuitry (e.g., write driver circuitry, sense amplifier circuitry, and pass transistors that couple the write driver circuitry and sense amplifier circuitry to bit lines of the memory array) may operate in response to a periphery supply voltage of about 0.56 Volts, while an associated memory array (e.g., word lines and memory cells) may require a minimum memory array supply voltage greater than 0.56 Volts (e.g., around 0.96 Volts or more). However, writing into a memory cell in a memory system with a large dual rail voltage supply differential (i.e, a large difference between the periphery supply voltage and the memory array supply voltage) or a very low periphery supply voltage is a challenge, and it is possible that write operations will fail, because the memory periphery circuitry (which operates in response to the relatively low periphery supply voltage) is not able to sufficiently drive the bit line voltages to change the state of a data value stored in the memory cell. Even if write operations are successful, the large differential between the array supply voltage and the periphery supply voltage results in a relatively slow write speed, because the relatively weak drive associated with the memory periphery circuitry will take a relatively long time to change the state of a data value stored in the memory cell.

Providing larger write drivers in the memory periphery circuitry may eliminate failed write operations (and speed up slow write operations). However, larger write drivers would undesirably require a larger circuit layout and higher power consumption.

Accordingly, it would be desirable to have an improved method and circuit for writing data into memory cells in a system with a large dual rail voltage supply differential. More specifically, it would be desirable for such an improved method and circuit to reliably complete write operations within a predetermined (and relatively short) write pulse window. It would further be desirable for such an improved method and circuit to improve the drive of write data onto bit lines of the memory without increasing the strength of existing write drivers, and adding minimal circuitry to a conventional embedded memory design.

SUMMARY

Accordingly, a method and structure are provided for using a sense amplifier to boost write voltages, thereby improving the reliability and speed of write operations performed in a memory having a differential between an array supply voltage and a periphery supply voltage, or a low periphery supply voltage.

In a particular embodiment, a memory includes a memory cell that operates in response to an array supply voltage VA, and a pair of bit lines coupled to the memory cell, wherein the bit lines are pre-charged to a periphery supply voltage VDDP prior to accesses to the memory cell, wherein the periphery supply voltage VDDP is less than the array supply voltage VA. The memory further includes a sense amplifier that operates in response to the periphery supply voltage during accesses to the memory cell, and a first pair of transistors that couple the sense amplifier to the bit lines during write accesses to the memory cell, such that the sense amplifier pulls one of the bit lines toward the periphery supply voltage VDDP, and pulls the other one of the bit lines toward the VSS (ground) supply voltage. By coupling the sense amplifier to the bit lines during write accesses, the drive of write data voltages onto the bit lines is improved, thereby improving the reliability and speed of the write accesses.

In another embodiment, a method of operating a memory includes: 1) operating a memory cell in response to an array supply voltage VA, 2) pre-charging a pair of bit lines coupled to the memory cell to a periphery supply voltage VDDP prior to accesses to the memory cell, wherein the periphery supply voltage is less than the array supply voltage, 3) operating a sense amplifier in response to the periphery supply voltage, and 4) coupling the sense amplifier to the bit lines through a first pair of transistors during write accesses to the memory cell, such that the sense amplifier pulls one of the pair of bit lines toward the periphery supply voltage VDDP, and pulls the other one of the bit lines toward the VSS (ground) supply voltage.

Another embodiment includes a computer readable medium storing instructions, which when executed by a processor, perform the steps of: operating a memory cell in response to an array supply voltage VA; pre-charging a pair of bit lines coupled to the memory cell to a periphery supply voltage VDDP prior to accesses to the memory cell, wherein the periphery supply voltage is less than the array supply voltage; operating a sense amplifier in response to the periphery supply voltage; and coupling the sense amplifier to the bit lines through a first pair of transistors during write accesses to the memory cell, such that the sense amplifier pulls one of the pair of bit lines toward the periphery supply voltage VDDP and pulls the other one of the bit lines toward the VSS (ground) supply voltage.

In yet another embodiment, a memory system includes a memory cell that operates in response to an array supply voltage VA, and a pair of bit lines coupled to the memory cell, wherein the bit lines are pre-charged to a periphery supply voltage VDDP prior to accesses to the memory cell, and wherein the periphery supply voltage is less than the array supply voltage. The memory further includes a sense amplifier that operates in response to the periphery supply voltage during accesses to the memory cell, and means for coupling the sense amplifier to the bit lines during write accesses to the memory cell, such that the sense amplifier pulls one of the pair of bit lines toward the periphery supply voltage VDDP, and pulls the other one of the pair of bit lines toward a VSS (ground) supply voltage.

The present invention will be more fully understood in view of the following description and drawings.

DETAILED DESCRIPTION

In general, the present invention provides a method and circuitry for coupling a sense amplifier to bit lines during a write operation, thereby boosting a write voltage developed on the bit lines during the write operation. Boosting the write voltage in this manner advantageously ensures reliable write operations, while adding minimal circuitry to a conventional memory design. Boosting the write voltage in this manner also results in write operations being completed in a relatively fast manner, thereby enabling a fast operating frequency of the memory.

Figure 1:
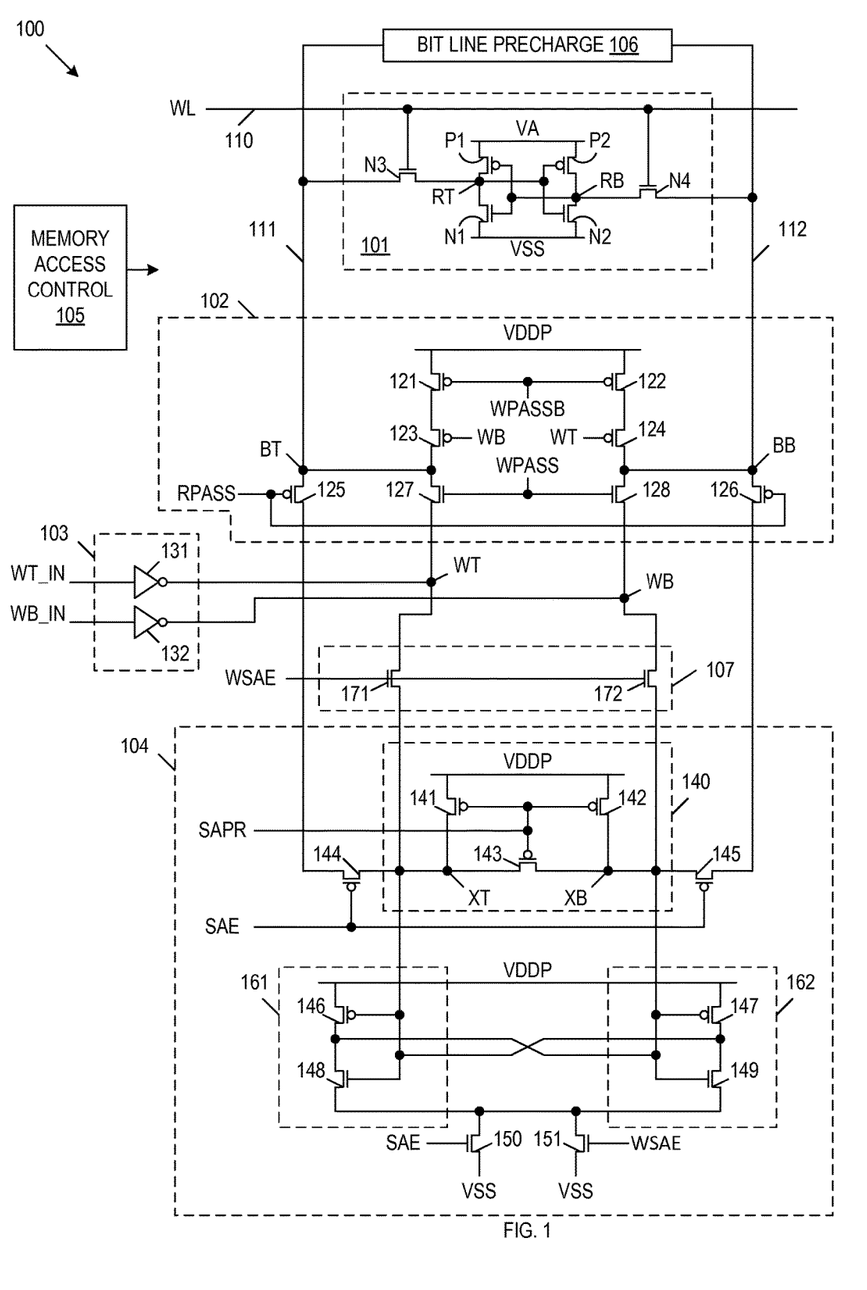
FIG. 1 is a circuit diagram of a portion of a memory system in accordance with one embodiment of the present invention.

FIG. 1 is a circuit diagram of a portion of an embedded memory 100, which includes static random access memory (SRAM) cell 101, read/write pass gate circuitry 102, local write driver circuitry 103, sense amplifier circuitry 104, memory access control circuitry 105, bit line pre-charge circuitry 106 and write sense amplifier coupling circuitry 107. In one embodiment, the illustrated elements of embedded memory 100 are fabricated on a single integrated circuit chip. Memory cell 101 is part of a larger memory array (not shown), which includes multiple rows and columns of memory cells. Each row of memory cells is coupled to a corresponding word line (like word line 110) and each column of memory cells is coupled to a pair of corresponding bit lines (like bit lines 111-112) in a manner well known to those skilled in the art.

SRAM cell 101 includes p-channel transistors P1-P2 and n-channel transistors N1-N4, which are connected as illustrated. In general, transistors P1-P2 and N1-N2 form cross-coupled inverters, wherein transistors P1-P2 are coupled to a positive array supply voltage VA, and transistors N1-N2 are coupled to the ground supply voltage VSS. In the described example, the array supply voltage VA has a nominal value of about 0.96 Volts, and the ground supply voltage VSS is 0 Volts. As described in more detail below, in order to enable access to SRAM cell 101 during read and write operations, the word line voltage WL on word line 110 is pulled up to the array supply voltage VA. Although memory cell 101 is an SRAM cell in the described examples, it is understood that memory cell 101 may be implemented using another type of memory cell (which operates in response to the array supply voltage VA) in other embodiments.

Read/write pass gate circuitry 102, local write driver circuitry 103, sense amplifier circuitry 104, bit line pre-charge circuitry 106 and write sense amplifier coupling circuitry 107, which are considered peripheral circuits of the memory 100, operate in response to a lower periphery supply voltage VDDP. In the described examples, the periphery supply voltage VDDP has a nominal value of about 0.56 Volts. Although the described examples specify a particular array supply voltage (VA=0.96 Volts) and a particular periphery supply voltage VDDP=0.56 Volts), it is understood that other array supply voltages and periphery supply voltages can be implemented in other embodiments. For example, in various embodiments, the array supply voltage VA may have a nominal voltage of 0.7 Volts to 1.05 Volts, while the periphery supply voltage may have a nominal value of 0.56 Volts to 0.7 Volts. In one embodiment, the array supply voltage VA is at least about 400 mV higher than the periphery supply voltage VDDP. In another embodiment, the array supply voltage VA is at least about 450 mV higher than the periphery supply voltage VDDP. As described in more detail below, memory access control circuitry 105 provides the various control signals (WL, WPASS/WPASSB, RPASS, SAE, WSAE, SAPR) and the write data signals (WT_IN/WB_IN) used for accessing the memory 100. All of these control and write data signals swing between the periphery supply voltage VDDP and the ground supply voltage VSS, with the exception of the word line voltage WL applied to the word line 110, which swings between the array supply voltage VA and the ground supply voltage VSS. As described in more detail below, memory access control circuitry 105 also controls bit line pre-charge circuitry 106 to pre-charge the bit lines 111 and 112 to the periphery supply voltage VDDP prior to each access of the memory cell 101.

Local write driver circuitry 103 includes local write drivers 131 and 132. As described in more detail below, during write operations, write drivers 131 and 132 receive complementary write data values WT_IN and WB_IN, respectively, from memory access control circuitry 105, and in response, output write data voltages on write data terminals WT and WB, respectively.

Read/write pass gate circuitry 102 includes p-channel transistors 121-126 and n-channel transistors 127-128. P-channel write pass transistors 121 and 123 are connected in series between the periphery supply voltage VDDP and bit line 111. Similarly, p-channel write pass transistors 122 and 124 are connected in series between the periphery supply voltage VDDP and bit line 112. P-channel read pass transistors 125 and 126 couple bit lines 111 and 112, respectively, to sense amplifier circuitry 104. N-channel write pass transistors 127 and 128 couple the write data terminals WT and WB, respectively, to bit lines 111 and 112, respectively.

Sense amplifier circuitry 104 includes p-channel transistors 141-147 and n-channel transistors 148-151. In general, p-channel transistors 141-143 form a sense amplifier pre-charge circuit 140, which pre-charges the internal sense amplifier terminals XT and XB to the periphery supply voltage VDDP in response to a sense amplifier pre-charge signal SAPR provided by memory access control circuitry 105. Transistors 146-149 form cross-coupled inverters 161-162. P-channel transistors 144 and 145 are configured to selectively couple/decouple the internal sense amplifier terminals XT and XB to the read pass transistors 125 and 126, respectively, in response to a sense amplifier enable signal SAE provided by memory access control circuitry 105. N-channel transistors 150 and 151 are configured to selectively couple/decouple the cross coupled inverters 161-162 to the ground supply terminal VSS in response to the sense amplifier enable signal SAE and a write sense amplifier enable signal WSAE, respectively, provided by memory access control circuitry 105.

Write sense amplifier coupling circuitry 107 includes n-channel transistors 171 and 172 which are configured to couple the internal sense amplifier terminals XT and XB, respectively, to the write data terminals WT and WB, respectively, in response to the write sense amplifier enable signal WSAE. As described in more detail below, transistors 171 and 172 are turned on during write operations to memory cell 101, thereby coupling the sense amplifier circuitry 104 to the write data terminals WT and WB, thereby improving the drive of the write data voltages applied to bit lines 111 and 112. This improved drive results in improved write reliability and faster write speeds, while adding minimal circuitry. Although write sense amplifier coupling circuitry 107 includes two n-channel transistors in the illustrated example, it is understood that write sense amplifier coupling circuitry 107 can be implemented using other types and/or numbers of transistors (or switches) in other embodiments. However, the use of two n-channel transistors 171-172 advantageously minimizes the number (and sizes) of the transistors implemented in memory 100.

The operation of memory 100 will now be described in more detail.

Prior to the start of each read/write operation, the sense amplifier pre-charge signal SAPR applied to the gates of p-channel transistors 141-143 is activated low (i.e., pulled down to the ground supply voltage VSS) by memory access control circuitry 105. As a result, p-channel transistors 141-143 are turned on, thereby pre-charging each of the internal sense amplifier terminals XT and XB to the periphery supply voltage VDDP. In addition, the sense amplifier enable signal SAE applied to the gates of p-channel transistors 144-145 and the gate of n-channel transistor 150 is deactivated low (i.e., pulled down to the ground supply voltage VSS) by memory access control circuitry 105. As a result, p-channel transistors 144-145 are turned on, and n-channel transistor 150 is turned off prior to the start of each read/write operation. In addition, the write sense amplifier enable signal WSAE applied to the gates of n-channel transistors 151 and 171-172 is deactivated low (i.e., pulled down to the ground supply voltage VSS) by memory access control circuitry 105. As a result, n-channel transistors 151 and 171-172 are initially turned off prior to each read/write operation.

Also prior to the start of each read/write operation, memory access control circuitry 105 controls the bit line pre-charge circuitry 106 to pre-charge each of the bit lines 111 and 112 to the periphery supply voltage VDDP. In the described examples, bit line pre-charge circuitry 106 is conventional circuitry that is well known to those of ordinary skill in the art. In addition, the word line voltage WL is deactivated low (i.e., pulled down to the ground supply voltage VSS) by memory access control circuitry 105, such that the memory cell access transistors N3 and N4 are initially turned off, thereby isolating the cross-coupled inverters of memory cell 101 from the pre-charged bit lines 111-112.

Also prior to the start of each read/write operation, memory access control circuit 105 deactivates the read pass control signal RPASS (i.e., by pulling the RPASS sign up to the periphery supply voltage VDDP), and deactivates the write pass control signals WPASS and WPASSB (i.e., by pulling the WPASS signal down to the ground supply voltage VSS, and pulling the complementary WPASSB signal up to the periphery supply voltage VDDP). Under these conditions, read pass transistors 125-126 and write pass transistors 121-122 and 127-128 are all turned off prior to each read/write operation.

Read Operation

Figure 2:
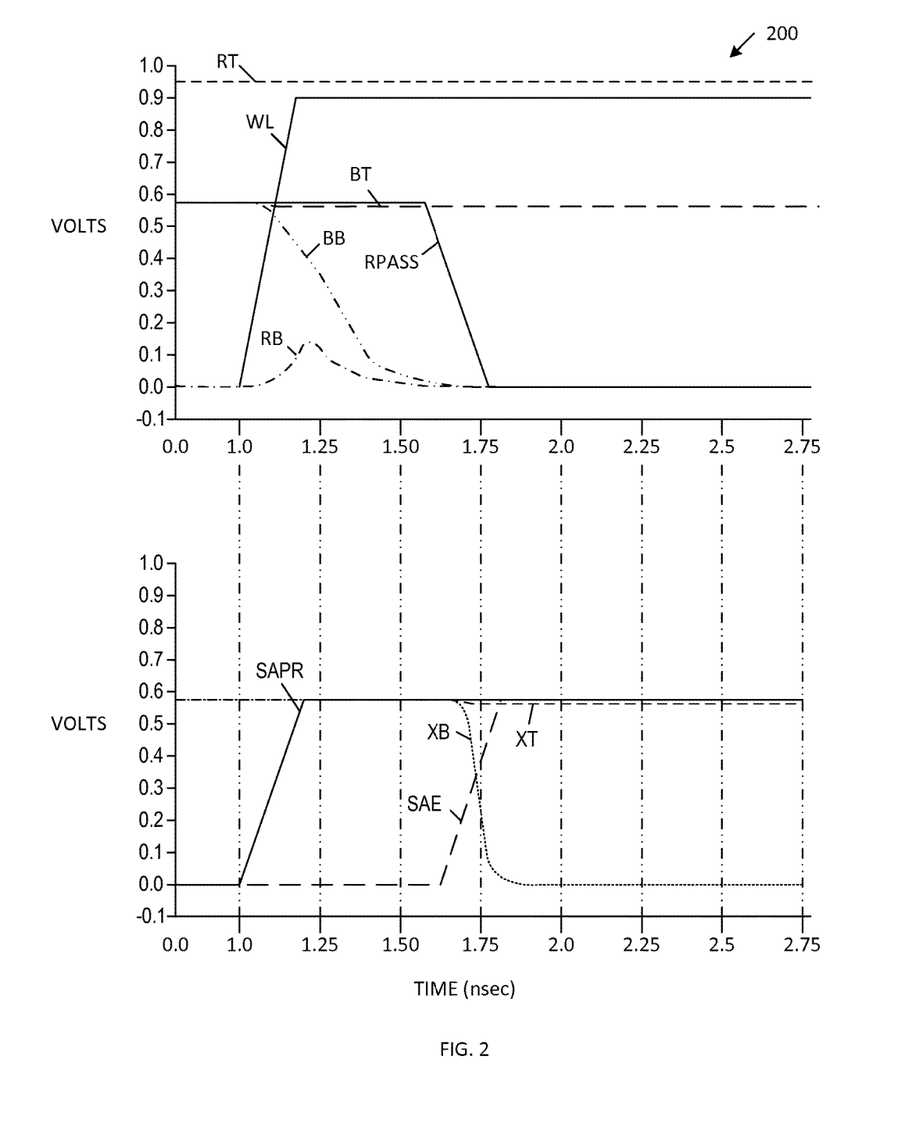
FIG. 2 is a waveform diagram of a read operation of the memory system of FIG. 1.

FIG. 2 is a waveform diagram 200 illustrating a read operation to memory 100. At time=0 nsec (i.e., prior to the start of the read operation), memory access control circuitry 105 provides the above-described initial signal conditions. The write sense amplifier enable signal WSAE and the write pass enable signal WPASS, which remain deactivated low (VSS) for the entire read operation, are not shown in FIG. 2 for reasons of clarity. The WPASSB signal, which remains deactivated high (VDDP) for the entire read operation is also not shown in FIG. 2 for clarity.

At the start of the read operation (i.e., at time=1.0 nsec), memory access control circuitry 105 deactivates the sense amplifier pre-charge signal SAPR applied to the gates of p-channel transistors 141-143 by driving this SAPR signal high (i.e., to the periphery supply voltage VDDP). As a result, the p-channel transistors 141-143 are turned off, thereby isolating the internal sense amplifier terminals XT and XB from the periphery supply voltage VDDP. Under these conditions, the internal sense amplifier terminals XT and XB are placed in a floating state, and are pre-charged to the periphery supply voltage (VDDP).

Also at the start of the read operation (i.e., at time=1.0 nsec), the memory access control circuitry 105 deactivates the bit line pre-charge circuit 106, such that this bit line pre-charge circuit 106 no longer actively drives the bit lines 111 and 112 to the periphery supply voltage VDDP (i.e., the bit lines 111-112 are floating, pre-charged to the periphery supply voltage VDDP). Memory access control circuitry 105 also activates the word line 110 by driving the word line voltage WL from the ground supply voltage VSS to the array supply voltage VA. The activated word line 110 turns on memory cell access transistors N3 and N4, thereby enabling the memory cell 101 to develop read data voltages BT and BB on bit lines 111 and 112, respectively. More specifically, one of the bit line voltages BT/BB is pulled down to the ground supply voltage VSS, while the other one of the bit line voltages BT/BB remains at the bit line pre-charge voltage of VDDP. In the illustrated example, memory cell 101 stores a logic '1' data value, wherein the bit cell voltage RT is pulled up to the array supply voltage VA (0.96 Volts) through turned on p-channel transistor P1, and the bit cell voltage RB is pulled down to the ground supply voltage VSS (0 Volts) through turned on n-channel transistor N2. In this example, the bit line voltage BB is pulled down toward the ground supply voltage VSS (0 Volts) through the turned on transistors N2 and N4. Note that the bit cell voltage RB is initially pulled up slightly in response to the pre-charge voltage on the bit line 112 (but this bit cell voltage RB returns to the ground supply voltage VSS). In addition, the bit cell voltage RT remains at the array supply voltage VA, and the bit line voltage BT remains substantially at the pre-charge voltage VDDP (i.e., turned on transistors P1 and N3 couple the bit line 111 to the array supply voltage VA, thereby preventing the pre-charged bit line 111 from discharging).

Around time=1.60 nsec, the bit line voltages BT/BB are resolved (e.g., the bit line voltage BB has been pulled down to the ground supply voltage VSS). At this time, read pass control signal RPASS signal applied to the gates of p-channel transistors 125-126 is activated low (VSS), thereby turning on the read pass transistors 125 and 126, such that the bit lines 111 and 112 are electrically connected to internal sense amplifier terminals XT and XB, respectively (through turned on p-channel transistors 125-126 and 144-145). Under these conditions, the read voltages BT and BB developed on the bit lines 111 and 112 are applied to the internal sense amplifier terminals XT and XB, respectively. In the described example, the internal sense amplifier terminal XT is pulled up toward the periphery supply voltage VDDP, and the internal sense amplifier terminal XB is pulled down toward the ground supply voltage VSS.

Around time=1.70 nsec, the sense amplifier enable signal SAE is driven high (VDDP), thereby turning off p-channel read pass transistors 144-145 and turning on n-channel transistor 150. Under these conditions, the read voltages developed on the internal sense amplifier terminals XT and XB are amplified and latched into the cross-coupled inverters 161-162. More specifically, the low state (VSS) of the internal sense amplifier terminal XB causes transistor 147 to turn on (and n-channel transistor 148 to turn off), and the high state (VDDP) of the internal sense amplifier terminal XT causes transistor 149 to turn on (and p-channel transistor 146 to turn off). This latched read data value is provided on read data lines (not shown) coupled to the internal sense amplifier terminals XT and XB.

At the end of the read operation (not shown), the read pass enable signal RPASS is deactivated high to the periphery supply voltage VDDP (thereby turning off read pass transistors 125-126), the word line voltage WL is deactivated low to the ground supply voltage VSS (thereby turning off memory cell access transistors N3-N4), and the bit line pre-charge circuit 106 is then activated (thereby pre-charging bit lines 111-112 to the periphery supply voltage VDDP prior to the next access). In addition, the sense amplifier pre-charge signal SAPR is activated low to the ground supply voltage VSS (thereby turning on sense amplifier pre-charge transistors 141-143), to pre-charge the internal sense amplifier terminals XT and XB to the periphery voltage supply VDDP prior to the next access. The sense amplifier enable signal SAE is also deactivated low (thereby turning on p-channel transistors 144-145 and turning off n-channel transistor 150). The read operation is completed once the bit line voltage BB pre-charges back to the periphery supply voltage VDDP (not shown).

Write Operation

Figure 3:
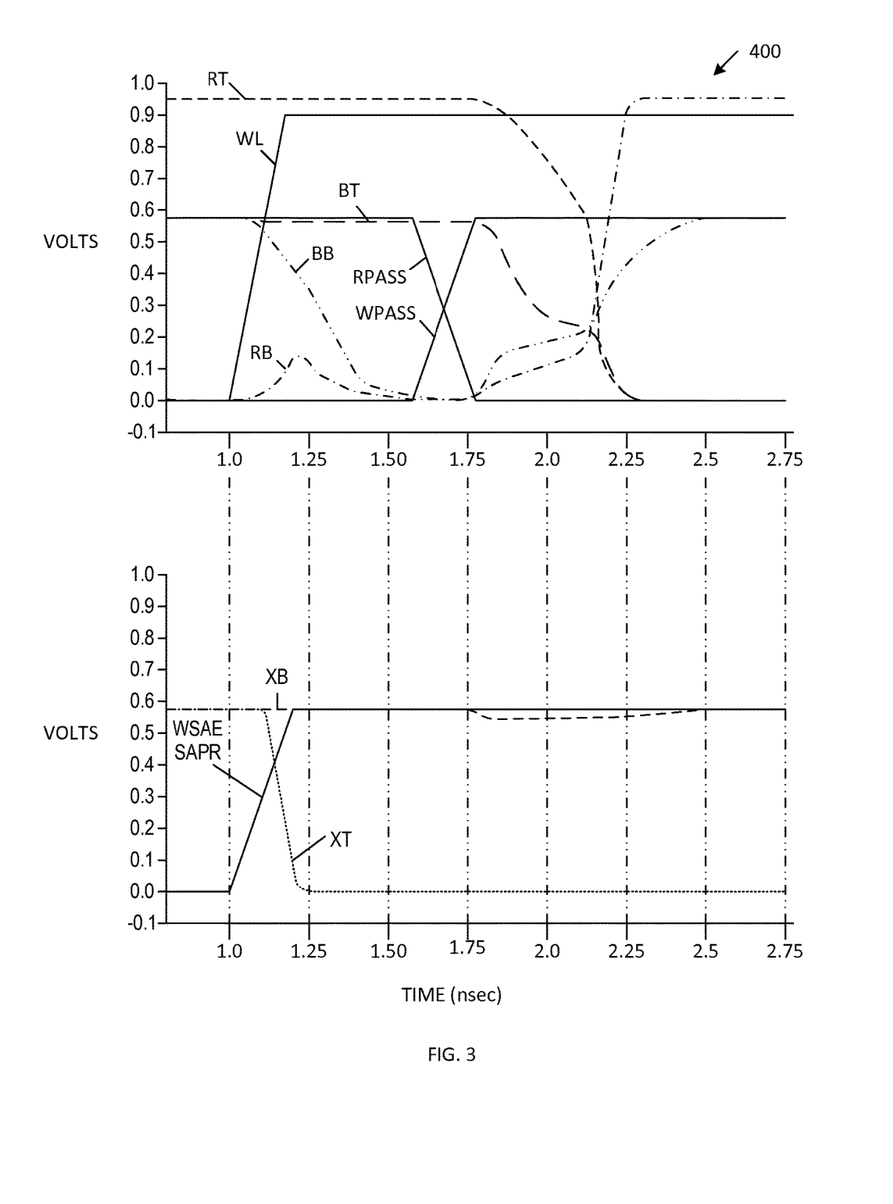
FIG. 3 is a waveform diagram of a write operation to the memory system of FIG. 1.

FIG. 3 is a waveform diagram 300 illustrating a write operation to memory 100. At time=0 nsec (i.e., prior to the start of the write operation), memory access control circuitry 105 provides the above-described initial signal conditions. The sense amplifier enable signal SAE, which remains low (VSS) for the entire write operation, is not illustrated in FIG. 3 for clarity. The WPASSB signal (which is the complement of the WPASS signal) is also not shown in FIG. 3 for clarity.

At the start of the write operation (i.e., at time=1.0 nsec), memory access control circuitry 105 deactivates the sense amplifier pre-charge signal SAPR applied to the gates of p-channel transistors 141-143 by driving this SAPR signal high (i.e., to the periphery supply voltage VDDP). As a result, the p-channel transistors 141-143 are turned off, thereby isolating the internal sense amplifier terminals XT and XB from the periphery supply voltage VDDP. Also during the write operation, memory access control circuitry 105 keeps the sense amplifier enable signal SAE low (VSS), thereby turning on p-channel transistors 144-145, and turning off n-channel transistor 150. Under these conditions, the internal sense amplifier terminals XT and XB are placed in a floating state, and are pre-charged to the periphery supply voltage (VDDP).

Also at the start of the write operation (i.e., at time=1.0 nsec), the memory access control circuitry 105 deactivates the bit line pre-charge circuit 106, such that this bit line pre-charge circuit 106 no longer actively drives the bit lines 111 and 112 to the periphery supply voltage VDDP (i.e., the bit lines 111-112 are floating, pre-charged to the periphery supply voltage VDDP). Memory access control circuitry 105 also activates the word line 110 by driving the word line voltage WL from the ground supply voltage VSS to the array supply voltage VA. The activated word line 110 turns on memory cell access transistors N3 and N4, thereby enabling the memory cell 101 to develop read data voltages BT and BB on bit lines 111 and 112, respectively. More specifically, one of the bit line voltages BT/BB is pulled down to the ground supply voltage VSS, while the other one of the bit line voltages BT/BB remains at the bit line pre-charge voltage of VDDP. In the illustrated example, memory cell 101 stores a logic '1' data value, wherein the bit cell voltage RT is pulled up to the array supply voltage VA (0.96 Volts) through turned on p-channel transistor P1, and the bit cell voltage RB is pulled down to the ground supply voltage VSS (0 Volts) through turned on n-channel transistor N2. In this example, the bit line voltage BB is pulled down toward the ground supply voltage VSS (0 Volts) through the turned on transistors N2 and N4. Note that the bit cell voltage RB is initially pulled up slightly in response to the pre-charge voltage on the bit line 112 (but this bit cell voltage RB returns to the ground supply voltage VSS). In addition, the bit cell voltage RT remains at the array supply voltage VA, and the bit line voltage BT remains substantially at the pre-charge voltage VDDP (i.e., turned on transistors P1 and N3 couple the bit line 111 to the array supply voltage VA, thereby preventing the pre-charged bit line 111 from discharging).

Also at the start of the write operation (time=1.0 nsec), memory access control circuitry 105 provides complementary write data signals WT_IN and WB_IN to local write drivers 131 and 132, respectively, within write driver circuitry 103. In response, local write drivers 131 and 132 drive the corresponding write data voltages WT and WB. In the described example, the write drivers 131 and 132 drive the write data voltages WT and WB to the ground supply voltage VSS (0 Volts) and the periphery supply voltage VDDP (0.56 Volts), respectively. As a result, the logic '1' data value previously stored by memory cell 101 will be overwritten with a logic '0' data value. This creates a worst-case condition for a write operation.

Also at the start of the write operation (time=1.0 nsec), memory access control circuitry 105 activates the write sense amplifier enable signal WSAE high (i.e., drives WSAE from VSS to VDDP), thereby turning on n-channel transistors 151 and 171-172. When transistors 171-172 have fully turned on, the write data voltages WT and WB are applied to the internal sense amplifier terminals XT and XB, respectively, thereby driving the cross-coupled inverters 161-162 of sense amplifier 104. In the described example, the write data voltages WT and WB have values of 0 Volts (VSS) and 0.56 Volts (VDDP), respectively, thereby driving the internal sense amplifier terminals XT and XB to 0 Volts and 0.56 Volts, respectively. Consequently, the write data value is effectively latched into the cross coupled inverters 161-162 of sense amplifier 104. More specifically, the low WT/XT voltages cause p-channel transistor 146 to turn on, thereby pulling up the WB/XB voltages to the periphery supply voltage VDDP. Similarly, the high WB/XB voltages cause n-channel transistor 149 to turn on, thereby pulling down the WT/XT voltage to the VSS supply voltage (through turned on n-channel transistor 151). Note that the sense amplifier circuitry 104 latches (resolves) the write data voltages WB/WT at around time=1.25 nsec. In this manner, the sense amplifier circuitry 104 advantageously boosts (i.e., provides an improved drive to) the write data voltages WT and WB.

At time=1.60 nsec, the memory access control circuitry 105 activates the write pass control signal WPASS from the ground supply voltage VSS (0 Volts) to the periphery supply voltage VDDP (0.56 Volts). Under these conditions, n-channel write pass transistors 127-128 are turned on, thereby allowing the write data voltages WT and WB to be driven onto the bit lines 111 and 112, respectively. Thus, in the described example, the bit line voltage BT is pulled down toward the ground supply voltage VSS, and the bit line voltage BB is pulled up toward the periphery supply voltage VDDP.

Also at time=1.60 nsec, the memory access control circuitry 105 activates the complementary write pass control signal WPASSB low, by driving this signal to the ground supply voltage VSS (0 Volts). Under these conditions, p-channel write pass transistors 121-122 are turned on. The logic low write voltage WT causes p-channel transistor 124 to turn on, such that the bit line voltage BB is pulled up toward the periphery supply voltage VDDP through turned on p-channel transistors 122 and 124. Note that the logic high write voltage WB causes p-channel transistor 123 to turn off, thereby preventing the bit line voltage BT from being pulled up toward the periphery supply voltage VDDP through p-channel transistors 121 and 123.

Also at time=1.60 nsec, memory access control circuitry 105 activates the read pass control signal RPASS by driving this signal from the periphery supply voltage VDDP to the ground supply voltage VSS. The low RPASS signal causes p-channel read pass transistors 125 and 126 to turn on. As a result, the voltages developed on the internal sense amplifier terminals XT and XB are driven onto bit lines 111 and 112, respectively, through turned on p-channel transistors 125-126 and 144-145. In the described example, the bit line voltage BT is pulled down toward the ground supply voltage VSS through turned on p-channel transistors 125 and 144, and the bit line voltage BB is pulled up toward the periphery supply voltage VDDP through turned on p-channel transistors 126 and 145. These additional conductive pathways between the internal sense amplifier terminals XT and XB and the bit lines 111-112 advantageously increase the drive of the write data values on the bit lines 111-112.

As the bit line voltage BB increases, the bit cell voltage RB also increases, such that n-channel transistor N1 turns on and p-channel transistor P1 turns off within memory cell 101. Conversely, as the bit line voltage BT decreases, the bit cell voltage RT also decreases, such that p-channel transistor P2 turns on and n-channel transistor N2 turns off within memory cell 101. Shortly after time=2.25 nsec, the bit cell voltage RT is pulled down to the ground supply voltage VSS (0 Volts) through n-channel transistor N1, and the bit cell voltage RB is pulled up to the array supply voltage VA (0.96 Volts) through p-channel transistor P2. The voltages supplied by the internal sense amplifier terminals XT and XB ensure that the states of the bit cell voltages RT and RB transition reliably and quickly during the write operation.

Note that in a conventional memory cell, which does not boost the bit line voltages BT and BB using the voltages developed on the internal sense amplifier terminals XT and XB, it is possible that the bit cell voltages RT and RB are never driven to the voltages required to successfully complete the write operation.

For example, if the internal sense amplifier terminals XT and XB were not coupled to the bit lines 111 and 112 during the described write operation, the bit line voltage BT may only drop from 0.56 Volts to around 0.2 Volts, while the bit cell voltage RT may only drop from 0.96 Volts to around 0.7 Volts. Similarly, the bit line voltage BB may only increase from 0 volts to around 0.15 volts, and the bit cell voltage RB may only increase from 0 volts to around 0.1 Volts. However, in order for the write operation to be successful, the bit line voltage BT and the bit cell voltage RT should be pulled down to the ground supply voltage VSS, and the bit line voltage BB should be pulled up to the periphery supply voltage VDDP (0.56 Volts), and the bit cell voltage RB should be pulled up to the array supply voltage VA (0.96 Volts), as illustrated by FIG. 3. In this case, the write operation to memory cell 101 would fail without the improved drive provided by coupling the internal sense amplifier terminals XT and XB to bit lines 111 and 112 during the write operation.

Also, in a conventional memory cell, which does not boost the bit line voltages BT and BB using the voltages developed on the internal sense amplifier terminals XT and XB, an excessive amount of time may be required to ensure that the bit cell voltages RT and RB are reliably driven to the required voltages during a write operation. In the above-described example, the write operation to memory cell may be performed with an effective write time (EWT) of about $2.48 \times 10^{-1}$ seconds. However, if the internal sense amplifier terminals XT and XB were not coupled to the bit lines 111 and 112 during the described write operation, then the effective write time of this memory cell would be significantly longer (e.g., $8.19 \times 10^{-10}$ seconds) (or the write operation would fail). Thus, memory 101 advantageously provides an improved effective write margin, and an improved operating frequency by decreasing the write pulse window.

At the end of the write operation (not shown), the read pass enable signal RPASS is deactivated high to the periphery supply voltage VDDP (thereby turning off read pass transistors 125-126), and the write pass enable signal WPASS is deactivated low to the ground supply voltage VSS (thereby turning off write pass transistors 127-128). The write pass enable signal WPASSB is deactivated high to the periphery supply voltage VDDP (thereby turning off write pass transistors 121-122). In addition, the word line voltage WL is deactivated low to the ground supply voltage VSS (thereby turning off memory cell access transistors N3-N4). Note that the write operation is completed within the memory cell 101 when the bit cell voltage RB reaches about 90% of the array supply voltage VA, and the bit cell voltage RT reaches about 10% of the array supply voltage VA. Thus, in the illustrated example, the word line can be deactivated low around time=2.25 nsec. After the word line voltage WL is deactivated, memory access control circuitry 105 activates the bit line pre-charge circuit 106, thereby pre-charging bit lines 111-112 to the periphery supply voltage VDDP prior to the next access.

In addition, the write sense amplifier enable signal WSAE is deactivated low to the ground supply voltage VSS, thereby turning off n-channel transistors 151 and 171-172. The sense amplifier pre-charge signal SAPR is then activated low to the ground supply voltage VSS (thereby turning on sense amplifier pre-charge transistors 141-143), thereby pre-charging the internal sense amplifier terminals XT and XB to the periphery voltage supply VDDP prior to the next access.

Coupling the internal sense amplifier terminals XT and XB to the bit lines 111 and 112 during write operations in the manner described above provides the following additional advantages to memory 101. The difference between the array supply voltage VA and the periphery supply voltage VDDP can be made relatively large (i.e., the periphery supply voltage VDDP can be lower for a predetermined array supply voltage VA), thereby maximizing power savings within memory 100. In addition, the required layout area associated with coupling the internal sense amplifier terminals XT and XB to the bit lines 111 and 112 during write operations (i.e., the layout area associated with transistors 151 and 171-172) is less than the required layout area associated with increasing the strength of the existing write driver circuitry 103 to provide an equivalent increase in drive on the bit lines 111-112. Moreover, the leakage current associated with coupling the internal sense amplifier terminals XT and XB to the bit lines 111 and 112 during write operations (i.e., the leakage current associated with the operation of transistors 151 and 171-172) is less than the leakage current associated with increasing the strength of the existing write driver circuitry 103 to provide an equivalent increase in drive on the bit lines 111-112.

The above-described methods for controlling the operation of memory 100 can be implemented by one or more computer programs that execute on a programmable system including at least one programmable processor coupled to receive data and instructions from, and to transmit data and instructions to, a data storage system, at least one input device, and at least one output device. Each computer program can be implemented in a high-level procedural or object-oriented programming language or in assembly or machine language, if desired; and in any case, the language can be a compiled or interpreted language. Suitable processors include, by way of example, both general and special purpose microprocessors, as well as other types of microcontrollers. Generally, a processor will receive instructions and data from a read-only memory and/or a random access memory. Generally, a computer will include one or more mass storage devices for storing data files; such devices include magnetic disks, such as internal hard disks and removable disks, magneto-optical disks, and optical disks. Storage devices suitable for tangibly embodying computer program instructions and data include all forms of non-volatile memory, including by way of example semiconductor memory devices, such as EPROM, EEPROM, and flash memory devices, magnetic disks such as internal hard disks and removable disks, magneto-optical disks, and CDROM disks. Any of the foregoing can be supplemented by, or incorporated in, application-specific integrated circuits (ASICs).

Although illustrative embodiments of the invention have been described in detail herein with reference to the accompanying figures, it is to be understood that the invention is not limited to those precise embodiments. Thus, the scope of the invention is defined by the following claims and their equivalents.

We claim:

1. A memory comprising:
   a memory cell that operates in response to an array supply voltage, wherein the memory cell stores a data value by pulling a bit cell voltage to the array supply voltage;
   a pair of bit lines coupled to the memory cell;
   bit line pre-charge circuitry that pre-charges the bit lines to a periphery supply voltage prior to accesses to the memory cell, wherein the periphery supply voltage is less than the array supply voltage;
   write driver circuitry that drives write data voltages to the bit lines during write accesses to the memory cell; and
   a sense amplifier that operates in response to the periphery supply voltage during accesses to the memory cell, wherein the sense amplifier is enabled to store data values provided on the pair of bit lines during read accesses to the memory cell, and wherein the sense amplifier is enabled during write accesses to the memory cell, such that the sense amplifier pulls one of the bit lines toward the periphery supply voltage in response to the write data voltages provided by the write driver circuitry.

2. The memory of claim 1, further comprising:
   a first pair of transistors that couple the sense amplifier to the bit lines during write accesses to the memory cell; and
   a pair of read access transistors that couple the pair of bit lines to the sense amplifier during read accesses and write accesses to the memory cell.

3. The memory of claim 1, further comprising a word line coupled to the memory cell, wherein the array supply voltage is applied to the word line to access the memory cell.

4. The memory of claim 1, wherein the array supply voltage is at least about 400 mV-450 mV higher than the periphery supply voltage.

5. The memory of claim 1, further comprising a first pair of write pass transistors that couple the write driver circuitry to the pair of bit lines during the write accesses to the memory cell.

6. The memory of claim 5, further comprising a first pair of transistors that couple the sense amplifier to the first pair of write pass transistors.

7. The memory of claim 6, further comprising:
   a second pair of write pass transistors coupled to the periphery supply voltage; and
   a third pair of write pass transistors coupling the second pair of write pass transistors to the pair of bit lines.

8. The memory of claim 7, wherein write driver circuitry is coupled to gates of the third pair of write pass transistors.

9. The memory of claim 1, wherein the sense amplifier comprises a pair of cross-coupled inverters supplied by the periphery supply voltage.

10. The memory of claim 9, further comprising:
    a first transistor that enables the sense amplifier during read accesses to the memory cell; and
    a second transistor that enables the sense amplifier during write accesses to the memory cell.

11. The memory of claim 9, wherein the sense amplifier includes a pre-charge circuit for pre-charging the cross-coupled inverters prior to accesses to the memory cell.

12. The memory of claim 9, further comprising:
    a pair of read access transistors coupled to the pair of bit lines; and
    a pair of sense amplifier enable transistors coupling the cross-coupled inverters to the pair of read access transistors.

13. The memory of claim 1, wherein the memory cell comprises a static random access memory (SRAM) cell.

14. The memory of claim 1, wherein the write driver circuit drives one of the bit lines toward the periphery supply voltage during write accesses to the memory cell.

15. A method comprising:
    operating a memory cell in response to an array supply voltage, wherein the memory cell stores a data value by pulling a bit cell voltage to the array supply voltage;
    pre-charging a pair of bit lines coupled to the memory cell to a periphery supply voltage prior to accesses to the memory cell, wherein the periphery supply voltage is less than the array supply voltage;
    enabling write driver circuitry to drive write data voltages to the bit lines during write accesses to the memory cell;
    operating a sense amplifier in response to the periphery supply voltage during accesses to the memory cell, wherein the sense amplifier stores data values provided on the pair of bit lines during read accesses to the memory cell; and
    enabling the sense amplifier during write accesses to the memory cell, such that the sense amplifier pulls one bit line of the pair of bit lines toward the periphery supply voltage in response to the write data voltages provided by the write driver circuitry.

16. The method of claim 15, further comprising coupling the pair of bit lines to the sense amplifier through a pair of read access transistors during read accesses to the memory cell.

17. The method of claim 16, further comprising coupling the pair of bit lines to the sense amplifier through the pair of read access transistors during write accesses to the memory cell.

18. The method of claim 15 further comprising applying the array supply voltage to a word line coupled to the memory cell during accesses to the memory cell.

19. The method of claim 15, wherein the array supply voltage is at least about 400 mV-450 mV higher than the periphery supply voltage.

20. The method of claim 15, further comprising providing the write data voltages to the pair of bit lines through a first pair of write pass transistors during write accesses to the memory cell.

21. The method of claim 20, further comprising coupling the periphery supply voltage to one bit line of the pair of bit lines in response to the write data voltages.

22. The method of claim 15, further comprising pre-charging internal nodes of the sense amplifier to the periphery supply voltage prior to accesses to the memory cell.

23. A computer readable medium storing instructions, which when executed by a processor, perform the steps of:
operating a memory cell in response to an array supply voltage, wherein the memory cell stores a data value by pulling a bit cell voltage to the array supply voltage;
pre-charging a pair of bit lines coupled to the memory cell to a periphery supply voltage prior to accesses to the memory cell, wherein the periphery supply voltage is less than the array supply voltage;
enabling write driver circuitry to drive write data voltages to the bit lines during write accesses to the memory cell;
operating a sense amplifier in response to the periphery supply voltage during accesses to the memory cell, wherein the sense amplifier stores data values provided on the pair of bit lines during read accesses to the memory cell; and
enabling the sense amplifier during write accesses to the memory cell, such that the sense amplifier pulls one bit line of the pair of bit lines toward the periphery supply voltage in response to the write data voltages provided by the write driver circuitry.

24. A memory comprising:
a memory cell that operates in response to an array supply voltage, wherein the memory cell stores a data value by pulling a bit cell voltage to the array supply voltage;
a pair of bit lines coupled to the memory cell, wherein the bit lines are pre-charged to a periphery supply voltage prior to accesses to the memory cell, wherein the periphery supply voltage is less than the array supply voltage;
write driver circuitry that drives write data voltages to the bit lines during write accesses to the memory cell;
a sense amplifier that operates in response to the periphery supply voltage during accesses to the memory cell, wherein the sense amplifier is enabled to store data values provided on the pair of bit lines during read accesses to the memory cell; and
means for coupling the sense amplifier to the bit lines during write accesses to the memory cell, such that the sense amplifier pulls one bit line of the pair of bit lines toward the periphery supply voltage in response to the write data voltages provided by the write driver circuitry.

* * * * *